United States Patent [19]
Ishiwata

[11] Patent Number: 4,568,987
[45] Date of Patent: Feb. 4, 1986

[54] AMPLIFIER INPUT CIRCUIT HAVING A FIGURE EIGHT CONDUCTIVE PATTERN

[75] Inventor: Kazuaki Ishiwata, Maebashi, Japan

[73] Assignee: Victor Company of Japan, Limited, Japan

[21] Appl. No.: 563,433

[22] Filed: Dec. 20, 1983

[30] Foreign Application Priority Data

Dec. 20, 1982 [JP] Japan .................. 57-192559[U]

[51] Int. Cl.⁴ .......................... G11B 5/02; G11B 5/00
[52] U.S. Cl. ..................................... 360/67; 360/137
[58] Field of Search ....................... 360/67, 68, 137

[56] References Cited

U.S. PATENT DOCUMENTS

| | | | |
|---|---|---|---|
| 2,584,984 | 2/1952 | Camras | 179/100.2 |
| 3,215,995 | 11/1965 | Sierra | 360/67 |
| 3,705,954 | 12/1972 | Camras | 360/67 |
| 4,349,848 | 9/1982 | Ishii et al. | 360/68 |

OTHER PUBLICATIONS

"A Replay Amplifier Using Integrated Circuits" by G. Corinth, Funkschau, vol. 47, #5, pp. 75-76.

Primary Examiner—Vincent P. Canney
Attorney, Agent, or Firm—Pollock, Vande Sande & Priddy

[57] ABSTRACT

Disclosed is a circuit arrangement having an amplifier with first and second input terminals which are adapted to be coupled to a playback head, wherein the first input terminal of the amplifier is coupled through a first circuit section of a conductive pattern to a first terminal of the playback head and the second input terminal of the amplifier is coupled through a second circuit section of the conductive pattern to a second terminal of the playback head. The first and second circuit sections (3, 4) are arranged to insulatively cross each other at an intersection (6) to form a figure eight pattern having two loop sections of substantially equal areas to equalize the amounts of currents which are oppositely respectively induced in the first and second loop sections by an externally generated magnetic flux.

9 Claims, 4 Drawing Figures

FIG.1
FIG. 2 (prior art)
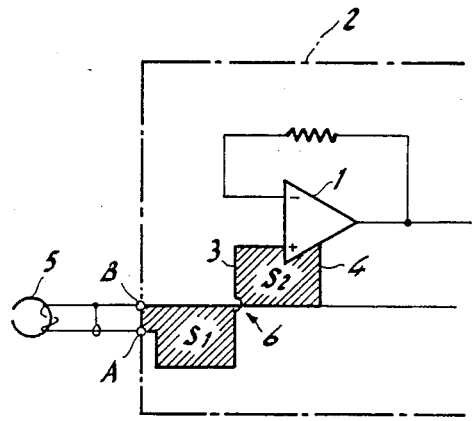
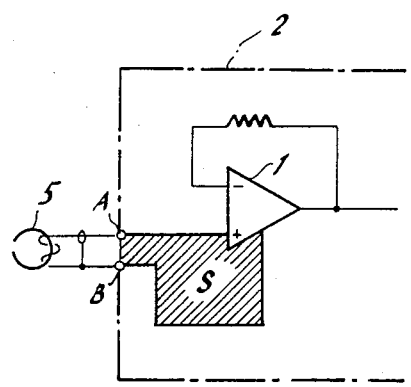
FIG. 3
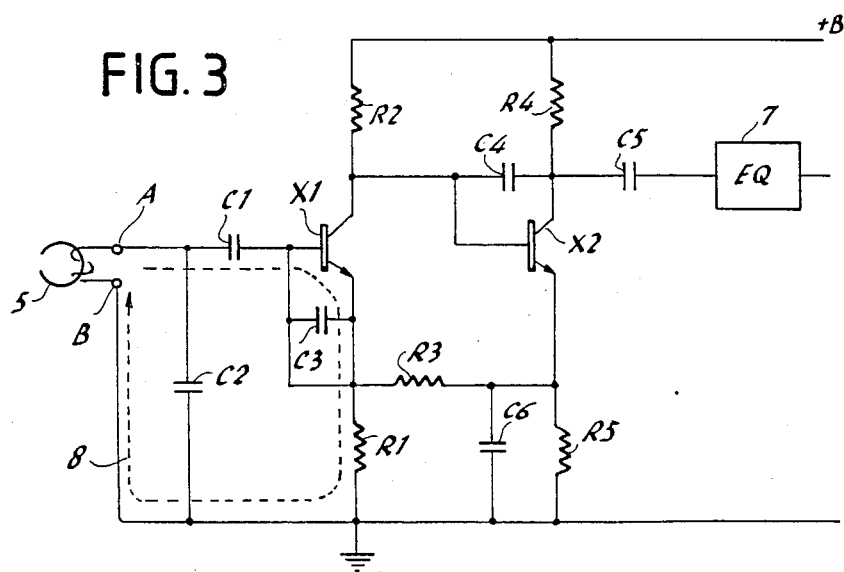

AMPLIFIER INPUT CIRCUIT HAVING A FIGURE EIGHT CONDUCTIVE PATTERN

BACKGROUND OF THE INVENTION

The present invention relates to a noise immune printed circuit particularly for use in tape recorders and record players.

Playback amplifiers used in tape recorders and record players are usually provided with an equalizer to emphasize lower frequency components to compensate for particular record-playback characteristics. The input circuit of the playback amplifier comprises a first circuit section which couples the base of a transistor to a first terminal of the playback head, and a second circuit section which couples the emitter of the transistor to the second terminal of the head. The collector of the transistor is coupled by way of capacitors to the equalizer. A loop is thus formed from the first and second circuit sections of the amplifier input circuit. In the presence of an external magnetic flux generated by a power supply unit or the like, a current will be induced by the magnetic flux in the loop circuit and fed as an induced noise to the amplifier. Since the frequency of the noise is low, the induced noise is considerably amplified by the equalizer. To suppress the noise the following points have usually been taken into consideration:

(1) To place the input circuit and the noise generating source as far apart from each other;
(2) To design a circuit pattern that minimizes the area of the loop; and
(3) To provide a magnetic shield over the loop.

However, difficulties have been encountered to meet these requirements simultaneously.

SUMMARY OF THE INVENTION

An object of the invention is therefore to provide a circuit arrangement which overcomes the disadvantages inherent in the prior art circuit arrangement.

This circuit arrangement of the invention includes an amplifier with first and second input terminals which are adapted to be coupled to a playback head, wherein the first input terminal of the amplifier is coupled through a first circuit section of a conductive pattern to a first terminal of the playback head and the second input terminal of the amplifier is coupled through a second circuit section of the conductive pattern to a second terminal of the playback head.

The invention is characterized in that the first and second circuit sections are arranged to insulatively cross each other at an intersection to form a figure eight pattern having two loop sections of substantially equal areas to equalize the amounts of currents oppositely respectively induced in the first and second loop sections by an externally generated magnetic flux. The induced currents are cancelled out by each other and the noise is suppressed significantly without employing means for shielding the input circuit of the amplifier.

The invention is particularly advantageous in situations where the power supply unit and transformer are to be located in specified positions and there is no freedom with which the circuit is designed.

BRIEF DESCRIPTION OF THE DRAWINGS

The present invention will be described in further detail with reference to the accompanying drawings, in which:

FIG. 1 is a schematic illustration of the input circuit of the preamplifier of the invention;

FIG. 2 is a schematic illustration of the input circuit of a prior art preamplifier;

FIG. 3 is an illustration of the circuit diagram of a preamplifier circuit including an equalizer that emphasizes low frequency components.

DETAILED DESCRIPTION

Figure 4:
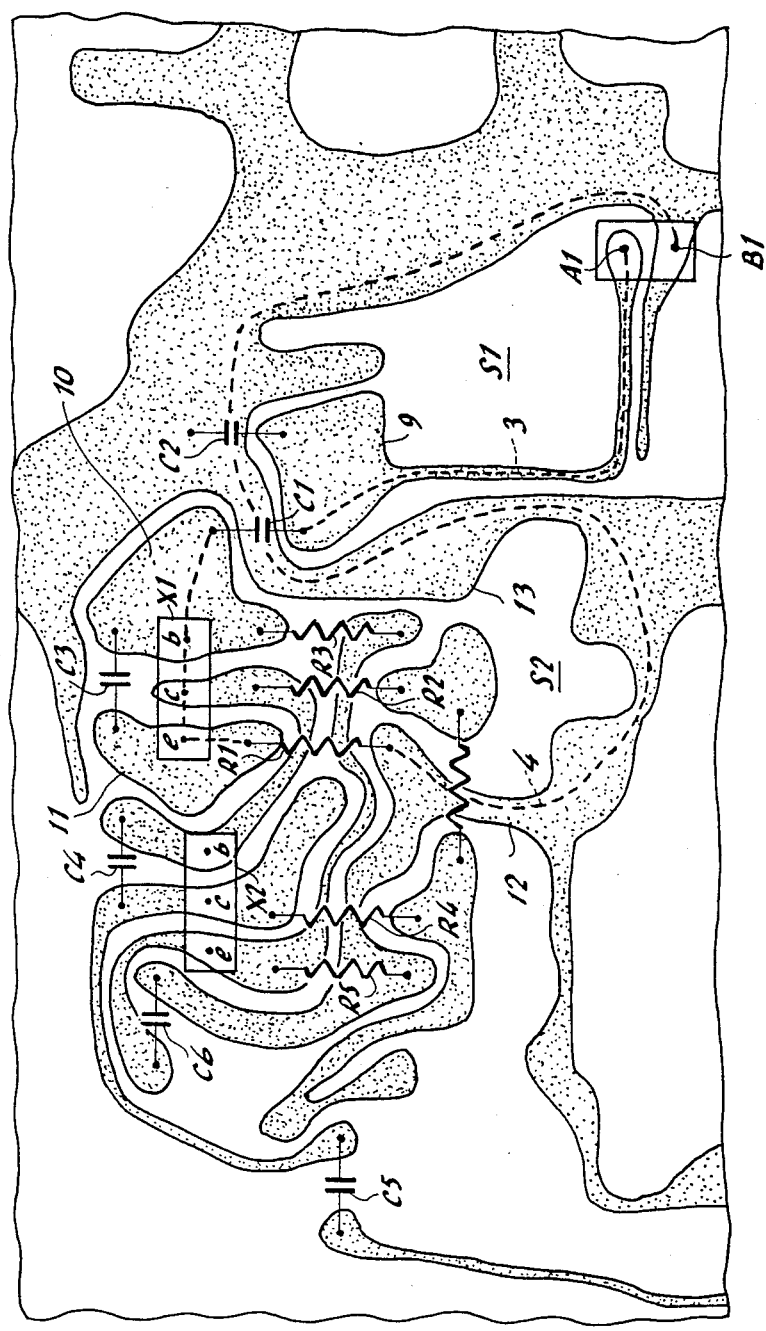
FIG. 4 is an illustration of the circuit pattern of a practical embodiment of the invention.

In a schematic illustration of FIG. 1, a preamplifier 1 is formed on a printed circuit board, or substrate 2. For purposes of illustration, the preamplifier 1 is shown in an operational amplifier configuration. The input circuit of the preamplifier comprises a first circuit section 3 and a second circuit section 4. The first circuit section 3 couples the noninverting input of the operational amplifier 1 through a terminal A to the playback head 5, and the second circuit section 4 couples the ground circuit of the amplifier 1 through a terminal B to the head 5. The first and second circuit sections 3 and 4 cross each other at a point 6 to form a figure eight pattern so that the two sections S1 and S2 of the figure eight pattern have substantially equal size and are configured such that their centers are in close proximity to each other. Since the magnetic fluxes generated by a power supply, not shown, pass through the loop sections S1 and S2 in the same direction with substantially equal densities and since the loops are cross-coupled at the intersection 6, currents induced in the first and second circuit sections 3 and 4 are of opposite polarities and of substantially equal amplitude. In contrast, the prior art input circuit can be illustrated as shown in FIG. 2 in which the portion marked S is subject to the magnetic flux of the power unit which contributes to noise.

In one embodiment of the invention in which the loop sections of the pattern are formed on the same side of the substrate, the intersecting conductors 3 and 4 are isolated from each other such that the first conductor 3 is interrupted by terminations through which the second conductor 4 extends and a circuit component of the input circuit, such as a capacitor, is coupled between the terminations. Whereas, if the loop sections are formed on opposite sides of the substrate there is no need to provide such circuit component at the intersection 6 and a greater degree of design freedom is allowed.

FIG. 3 is an illustration of the detail of the preamplifier 1 of FIG. 1. The preamplifier 1 includes a transistor X1 having a base coupled by a capacitor C1 to the terminal A and an emitter coupled by a resistor R1 to the terminal B with a junction between the resistor R1 and terminal B being coupled to ground. The collector of transistor X1 is coupled by a resistor R2 to a DC voltage supply +B, the junction between the collector and resistor R2 being coupled to the base of a second transistor X2 whose collector is connected to a junction between capacitors C4 and C5 and through a resistor R4 to the voltage supply +B. The capacitors C4 and C5 are connected in series from the collector of transistor X1 to an equalizer 7 having the characteristic of low frequency emphasis. The emitter of transistor X2 is coupled to ground by a resistor R5 which is in shunt with a capacitor C6. The base of transistor X1 is further coupled by a capacitor C3 to its emitter and by a resistor R3 to the emitter of transistor X2. The terminals A and B are coupled together by a capacitor C2 as illustrated.

The input circuit of the preamplifier 1 is indicated by a broken-line arrow 8.

A practical embodiment of the preamplifier 1 having an input circuit of the figure eight pattern is shown in FIG. 4 which will be described with reference to FIG. 3. Input terminals A and B are coupled via a shielded wire to the playback head 5 and therefore no or little noise is introduced into the connecting circuit therebetween. The first and second circuit sections 3 and 4 of the preamplifier and its associated circuits are formed by a printed conductive pattern on one surface of an insulative substrate. The first circuit section 3 extends from point A1 corresponding to the terminal A and advances through a portion 9 of the conductive pattern to one terminal of the capacitor C1 which is mounted on the other side of the substrate. The other terminal of capacitor C1 is connected to an island 10 to which the base of transistor X1 is connected. The first circuit section 3 terminates at the base of the transistor X1. The emitter of transistor X1 is provided on an island 11 which is coupled by resistor R1, which is also provided on the other side of the substrate, to a peninsula 12. The second circuit section 4 commences at the emitter of transistor X1 on island 11 through resistor R1 and passes through a portion 13 which extends over the capacitor C1 and over the capacitor C2, which is also provided on the other side of the substrate, and terminates at point B1 corresponding to terminal B.

It is seen that capacitor C1 serves as an insulating element between the first and second circuit sections 3 and 4. As discussed above, the loop sections S1 and S2 of the figure eight pattern have substantially equal areas equally exposed to magnetic flux from the power supply unit. The currents induced by the magnetic flux in the first and second circuit sections 3 and 4 therefore cancelled each other.

The foregoing description shows only a preferred embodiment of the present invention. Various modifications are apparent to those skilled in the art without departing from the scope of the present invention which is only limited by the appended claims. Therefore, the embodiments shown and described are only illustrative, not restrictive.

What is claimed is:

1. A circuit pattern formed on an insulative substrate for completing a circuit including a playback head having first and second terminals and an amplifier having first and second input terminals, comprising:

first and second conductive sections interposed between the playback head and the amplifier, said first input terminal of said amplifier being coupled through said first conductive section to said first terminal of said playback head and said second input terminal of said amplifier being coupled through said second conductive section to said second terminal of said plackback head, said first and second conductive sections further being arranged to mechanically cross each other and be electrically insulated from each other at an intersection to form a figure eight conductive pattern having two loop sections of substantially equal areas to equalize the respective amount of current oppositely induced in said first and second loop sections by an externally generated magnetic flux.

2. A circuit pattern as claimed in claim 1, wherein said first conductive section is interrupted at said intersection by two terminations through which said second conductive section extends, an electrical component being connected between said terminations.

3. A circuit pattern as claimed in claim 2, wherein said electrical component is a capacitor.

4. A circuit pattern as claimed in claim 2, wherein said electrical component is provided on the other side of said substrate.

5. A circuit pattern as claimed in claim 1, wherein said circuit pattern is coupled to an equalizer having low frequency response characteristics.

6. A reproducing apparatus having a playback head, comprising:

a printed circuit having a preamplifier and an equalizer coupled to said preamplifier having low frequency response characteristics;

said printed circuit including a first circuit section of a conductive pattern connecting a first terminal of said playback head to a first input terminal of said preamplifier, and a second circuit section of said conductive pattern connecting a second terminal of said playback head to a second input terminal of said preamplifier, said first and second circuit sections being arranged to insulatively cross each other at an intersection to form a figure eight pattern having two loop sections of substantially equal areas, whereby currents induced in said loop sections are of substantially equal magnitude of opposite polarities.

7. A reproducing apparatus as claimed in claim 6, wherein said first and second circuit sections are formed on one surface of a substrate, and said first circuit section is interrupted at said intersection by two terminations through which said second circuit section extends, further comprising a circuit component connected between said terminations.

8. A reproducing apparatus as claimed in claim 7, wherein said circuit component is a capacitor.

9. A reproducing apparatus as claimed in claim 7, wherein said circuit component is provided on the other surface of said substrate.

* * * * *